United States Patent Office 3,070,443

Patented Dec. 25, 1962

3,070,443

LIGHT SENSITIVE AROMATIC STILBENE COMPOUNDS AND THEIR USE IN PRESENSITIZED PRINTING PLATES

Wilhelm Neugebauer and Martha Tomanek, Wiesbaden-Biebrich, Germany, assignors, by mesne assignments, to Azoplate Corporation, Murray Hill, N.J., a corporation of New Jersey No Drawing. Filed June 29, 1956, Ser. No. 594,695
Claims priority, application Germany July 1, 1953
2 Claims. (Cl. 96—36)

This invention is concerned with improvements in or relating to light-sensitive material for photomechanical reproduction and a process employing the material in the manufacture of printing plates.

It has been suggested that in the preparation of printing plates for planographic printing or offset printing by photomechanical processes, light-sensitive material be used in which the light-sensitive layer is prepared without including colloid materials, e.g. albumen, gelatine or synthetic colloids. When such known simple light-sensitive material is exposed under a master, the solubility of the light-sensitive layer or the substances forming the light-sensitive layer is changed. When the exposed layer is treated with suitable solvents, either the light-struck areas, i.e. non-imaged areas, are removed (so that a positive printing plate is obtained from a positive master), or the non-light struck areas, i.e. the imaged areas, of the layer are removed (so that a negative printing plate is obtained from a positive master). For printing purposes it is necessary that the areas of the original light-sensitive layer remaining on the base should accept greasy printing ink, i.e. be oleophilic. Printing plates made for such purposes are usually sold in "presensitized form," i.e. a plate of sheet aluminum or sheet zinc with the light-sensitive material coated thereon. Such plates are usually purchased in quantity and stored by the customer until ready for use, i.e. exposure to a light image. An important property of such plates, therefore, is the ability to retain the light sensitivity unimpaired while being storaged.

It is an object of the present invention to provide an improved light-sensitive material. It is a further object to provide an improved method of producing printing plates. Another object of the present invention is to provide a presensitized printing plate having excellent storagability and which is thereafter capable of long runs.

According to the present invention, light-sensitive material for photo-mechanical reproduction is prepared comprising a base having a light-sensitive layer coated thereon which contains one or more stilbene compounds having one or more substituents of the following general formulae:

$$—SO_2—NH—Ar \text{ or } —NH—SO_2—Ar$$

in which Ar stands for an aromatic residue. The aromatic residue may be unsubstituted or may be substituted, for example with a methyl or methoxy group, or with halogen. According to a further feature of the invention, the stilbene compound may be further substituted with one or more halogen, nitro-, alkoxy,, or acylamino groups and styryl residues.

The base is preferably made of an aluminum or zinc sheet, but can be any flexible surface capable of accepting the light-sensitive layer of the invention and operable in a printing press.

Of especial interest are compounds coming within one of the following generic formulae:

(I)

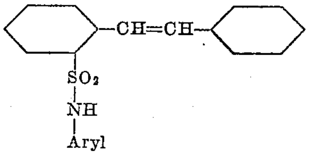

The compounds of Formulae 3, 4 and 5 are exemplary of this group.

(II)

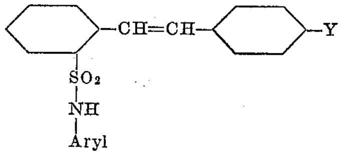

wherein Y=a styryl group.

The compound of Formula 6 is exemplary of this group.

(III)

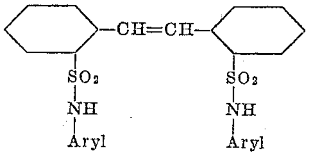

The compounds of Formulae 2 and 12 are exemplary of this group.

(IV)

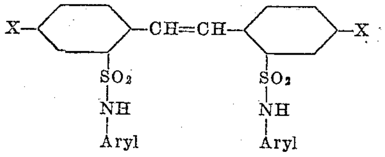

wherein X=nitro or amino groups.

The compounds of Formulae 1, 8 and 11 are exemplary of the nitro-group substituent, whereas the compound of Formula 10 illustrates the amino group substituent.

(V)

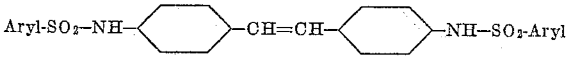

The compounds of Formulae 7 and 9 are exemplary of this group.

Examples of the stilbene compounds which may be used in accordance with the present invention for the production of the light-sensitive layer are shown in the following formulae:

Formula 1:

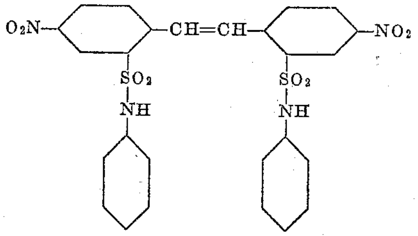

Formula 2:

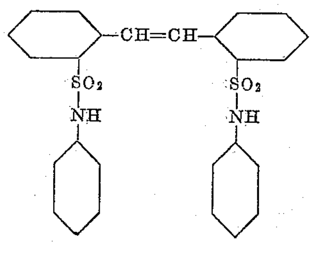

Formula 3:

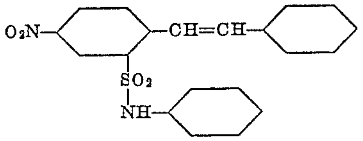

Formula 4:

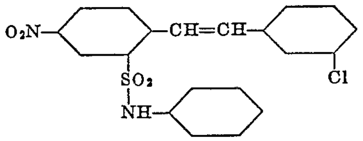

Formula 5:

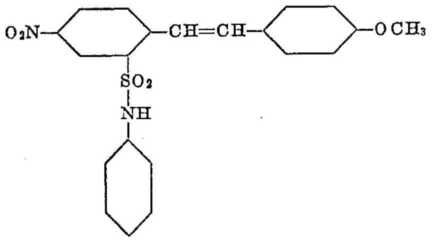

Formula 6:

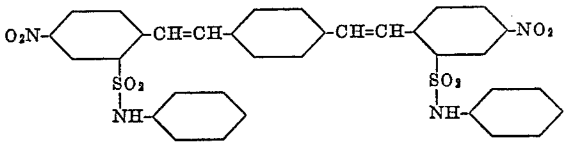

Formula 12:

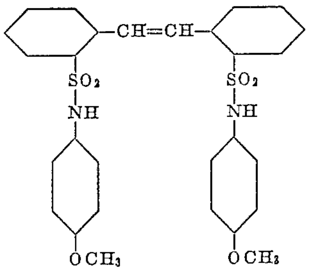

These compounds are prepared and identified as follows:

(1) 4,4'-dinitro-2,2'-disulfanilido-stilbene is prepared by condensing 4,4'-dinitro-stilbene-2,2'-disulfochloride (described by Green, Marsden, and Scholfield in "Journal of the American Chemical Society," vol. 85, 1904, page 1434) with an excess of aniline at room temperature, while constantly stirring. After 12 hours the condensation mixture is treated with dilute hydrochloric acid in order to remove the surplus aniline. The remnant, which is insoluble in hydrochloric acid, is the 4,4'-dinitro-2,2'-disulfanilido-stilbene.

(2) 2,2'-disulfanilido-stilbene is prepared from stilbene-2,2'-disulfochloride (described by Ruggli and Peyer in "Helvetica Chimica Acta," vol. 9, page 950) and aniline at room temperature in analogy to the preparation of the compound 1, and the condensation product is further treated as is the condensation product in the preparation of compound 1.

(3) 4-nitro-2-sulfanilido-stilbene (M.P. 206°), described by Ullman and Geschwind in "Berichte der Deutschen Chemischen Geselschaft," 41 (1908), p. 2293.

Formula 7:

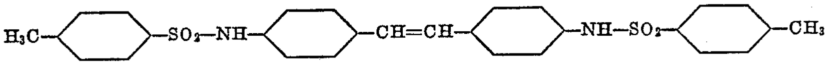

Formula 8:

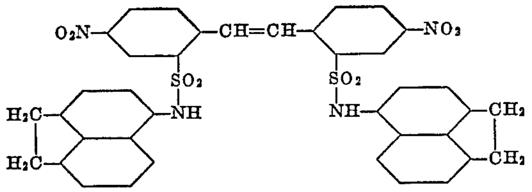

(4) 4-nitro-3'-chloro-2-sulfanilido-stilbene is prepared by making a melt of 4-nitro-2-sulfanilido-toluene (described by Ullman and Geschwind in "Berichte der Deutschen Chemischen Gesellschaft," vol. 41, 1908, page 2293) and 3-chloro-benzaldehyde at 160° C. in the presence of piperidine.

(5) 4-nitro-4'-methoxy-2-sulfanilido-stilbene is prepared in analogy to the compound 4 by making a melt of 4-nitro-2-sulfanilido-toluene and anisic aldehyde at 160° C. in the presence of piperidine.

(6) Terephthalal - 4,4'-dinitro-2,2'-disulfanilido-ditoluene is prepared in analogy to the compound 4 by making a melt of 4-nitro-2-sulfanilido-toluene and terephthalaldehyde at 160° C. in the presence of piperidine.

(7) 4,4'-bis-(p-toluene-sulfonylamino)-stilbene is prepared from 4,4'-diamino-stilbene (described by Elbs and Hoermann in "Journal fur Praktische Chemie 2," vol. 39, page 502) and 1,4-toluene-sulfochloride. Both compounds are dissolved together in dioxane and then condensed by stirring for 12 hours at room temperature in the presence of sodium carbonate.

(8) 4,4' - dinitro - 2,2' - bis - (sulfo-acenaphthyl-(5")-amino)-stilbene is prepared from 4,4'-dinitro-stilbene-2,2'-disulfochloride (described by Green, Marsden and Scholfield in "Journal of the American Chemical Society," vol. 85, 1904, page 1434) and 5-amino-acenaphthene. Both compounds are dissolved together in dioxane and then condensed by stirring for 12 hours at room temperature in the presence of sodium carbonate.

Formula 9:

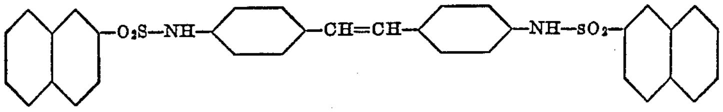

Formula 10:

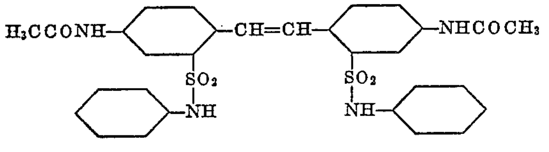

Formula 11:

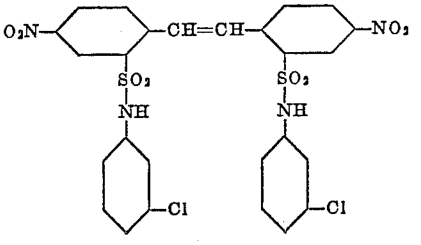

(9) 4,4' - bis-(naphthyl-(2')-sulfonylamino)-stilbene is prepared from 4,4'-diamino-stilbene (described by Elbs and Hoermann in "Journal fur Praktische Chemie 2," vol. 39, page 502) and naphthalene-(2)-sulfochloride. Both compounds are dissolved together in dioxane and then condensed by stirring for 12 hours at room temperature in the presence of sodium carbonate.

(10) 4,4'-di-acetylamino-2,2'-di-sulfanilido-stilbene is prepared by heating 4,4'-diamino-2,2'-disulfanilido-stilbene for three hours with acetic acid anhydride. 4,4'-diamino-2,2'-disulfanilido-stilbene is obtained by catalytically reducing in the presence of Raney nickel 4,4'-dinitro-2,2'-disulfanilido-stilbene. This compound is dissolved in dioxane and reduced at room temperature applying pressure.

(11) 4,4' - dinitro - 2,2' - bis - (sulfo - m - chloro - anilido)-stilbene is prepared by condensing 4,4'-dinitro-stilbene-2,2'-disulfochloride (described by Green, Marsden and Scholfield in "Journal of the American Chemical Society," vol. 85, 1904, page 1434) with 3-chloro-aniline at room temperature. In analogy to the condensation process described in connection with the preparation of compound 1 a surplus of 3-chloro-aniline is used. Both compounds are allowed to react upon each other for about 12 hours at room temperature.

(12) 2,2' - bis - (sulfo - p - methoxy - anilido) - stilbene is obtained by condensation of stilbene-2,2'disulfochloride (described by Ruggli and Peyer in "Helvetica Chimica Acta," vol. 9, page 950) and 4-amino-anisol. Both compounds are dissolved together in dioxane and left standing for 12 hours at room temperature in the presence of sodium carbonate.

In order to prepare the light-sensitive material required for the production of printing plates, it is preferable to apply solutions of the stilbene compounds to be used on an aluminum foil, which may also be provided with an electro-chemically or chemically produced aluminum oxide surface layer. The coating of the solution on the base may, for example, be carried out in a plate whirler. Such organic solvents as alcohol, dioxane, glycol monomethyl ether, pyridine, benzene, xylene, or mixtures thereof may be used for the preparation of the solution. The coated base is then dried.

The stilbene compounds disclosed above in the present invention may also be used in a mixture with each other. This is of particular advantage if the individual compounds have a tendency towards crystallization. By the use of mixtures of a number of stilbene compounds an even coating of the base is obtained.

The present invention further provides a method of producing printing plates which comprises exposing the light-sensitive material of the invention to a light image. The light source used may, for example, be an arc lamp or a mercury lamp. The exposed material is treated with a dilute alkaline solution. The plate is then rinsed with water and wiped over with a dilute acid. The dilute alkaline solution may be sodium hydroxide, sodium carbonate, trisodium phosphate or a mixture of tri- and disodium phosphates. An organic solvent such, for example, as ethyl alcohol, methyl alcohol, acetone, methyl ethyl ketone or glycol monomethyl ether may be added to the dilute alkaline solution.

Preferably phosphoric acid is used as the dilute acid. The plate is simultaneously or sequentially rubbed in with greasy ink. The greasy ink may be applied by hand or mechanically by the printing machine.

Long runs may be obtained by using printing plates prepared in accordance with the present invention. One advantage of the light-sensitive material according to this invention, is, that the material has a particularly good stability and can be stored very well in an unexposed state even under unfavorable atmospheric conditions.

It has not been previously found possible to produce layers suitable for the photo-mechanical production of flat printing plates by the use of stilbene compounds.

The introduction of one or more of the substituents defined heretofore by their general formulae into the stilbene molecule makes it possible to obtain light-sensitive layers which produce, after exposure, images which are receptive to greasy ink and thus can be used for the production of printing plates.

Following is a description by way of example of methods of carrying the present invention into effect.

*Example I*

A solution of 1 part by weight of 4,4'-dinitro-2,2'-disulfanilido-stilbene (Formula 1) in 100 parts by volume of glycol monomethyl ether was applied to the roughened surface of an aluminum foil by means of a plate whirler and then dried. The layer side of the dried material was exposed under a negative master using an 18 amp. arc lamp at 60 cm. distance for about 4-minutes and the exposed layer was wiped over first with 50% alcohol, and then with a mixture of equal parts by volume of 3% disodium phosphate solution and 3% trisodium phosphate solution. The foil so treated was washed well with water and rubber over with greasy ink in the presence of 3% phosphoric acid. A reverse image of the master (positive from negative) appeared, from which it was possible to print, after mounting the plate in an offset machine. The length of run was very high.

*Example II*

A solution of 1 part by weight of a mixture of 4-nitro-2-sulfanilido-stilbene (Formula 3) and 4-nitro-3'-chloro-2-sulfanilido stilbene (Formula 4), in a proportion of 1:1, in 100 parts by volume of dioxane was coated onto an aluminum foil by the method outlined in Example I. The subsequent procedure was as outlined in Example I and a reverse image of the master was obtained.

*Example III*

An anodically oxidized aluminum foil was coated with a solution of 2 parts by weight of 2,2'-disulfanilido-stilbene (Formula 2) in 100 parts by volume of a mixture of dioxane and ethyl alcohol (in a proportion of 1:1) and the coated foil was dried and exposed under a positive master. The exposed surface of the foil was then rubbed with a 3% solution of sodium carbonate to which 1% of glycol monomethyl ether had been added, well washed with water and rubber over with greasy ink and 2% phosphoric acid. A positive image appeared and a positive printing plate was obtained. The layer containing 2,2'-disulfanilido-stilbene had an almost unlimited life in the unexposed state.

*Example IV*

For coating the roughened surface of an aluminum foil, a 1% solution of 4-nitro-4'-methoxy-2-sulfanilido-stilbene (Formula 5) in alcohol was used, and the subsequent procedure was that described in Example I, but with the exception that the exposed layer was treated with a 0.5% caustic soda solution. A positive printing plate was obtained from a negative master.

*Example V*

0.5 part by weight of terephthalal-4,4'-dinitro-2,2'-disulfanilido-ditoluene (Formula 6) were dissolved in 100 parts by volume of glycol monomethyl ether. An aluminum plate was coated with this solution and the layer produced subsequently dried. The coated material was then exposed under a negative master and the exposed layer was treated with 80% alcohol, then with a 3% solution of trisodium phosphate, washed with water and rubber in with greasy ink and dilute phosphoric acid. From the negative master a reversed, i.e. positive image, was obtained and thereby a positive printing plate.

Instead of the stilbene compound mentioned above, 1% solutions of 4,4'-bis-(p-toluene-sulfonylamino)-stilbene (Formula 7), 4,4'-bis-(2-naphthyl-sulfonylamino)-stilbene (Formula 9) or 4,4'-dinitro-2,2'-bis-(sulfo-acenaphthyl)-(5″)-amino-stilbene (Formula 8) may be used for the production of the light-sensitive layers.

*Example VI*

For the coating of a surface roughened aluminum foil a 1% solution of 4,4′-diacetylamino-2,2′-disulfanilido-stilbene (Formula 10) in dioxane was used, and the remaining procedure was that described in Example I. A positive image, and thereby a positive printing plate, was obtained from a positive master.

*Example VII*

A 1% solution of 4,4′-dinitro-2,2′-bis-(sulfo-m-chloro-anilido)-stilbene (Formula 11) in dioxane was used for coating a superficially roughened aluminum foil. The further procedure is as in Example I, with the exception that the exposed layer was treated with a mixture of equal parts by volume of 1% disodium-phosphate solution and 1% trisodium phosphate solution. A positive printing plate is obtained from a negative master.

*Example VIII*

For coating an aluminum foil, a 1% solution of 2,2′-bis-(sulfo-p-methoxy-anilido)-stilbene (Formula 12) in ethylene glycol monomethyl ether was used, and the dried material was then subjected to the same procedure as described in Example I. A positive image, which means a positive printing plate, is obtained from a positive pattern.

This application is a continuation-in-part of application Serial No. 440,240, filed June 29, 1954, and now abandoned.

What we claim is:

1. A presensitized printing plate comprising an aluminum base coated with a layer comprising a compound having the formula

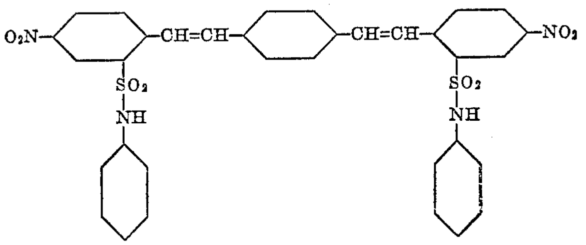

2. A compound having the formula

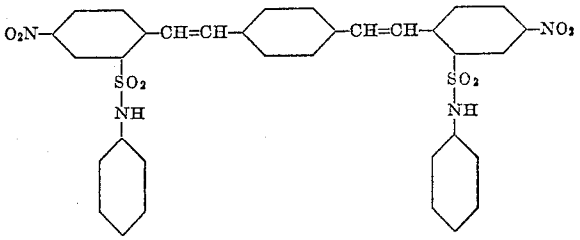

References Cited in the file of this patent

UNITED STATES PATENTS

| | | |
|---|---|---|
| 2,258,162 | Northy | Oct. 7, 1941 |
| 2,395,484 | Jennings | Feb. 26, 1946 |
| 2,435,629 | Jennings | Feb. 10, 1948 |
| 2,635,535 | Jennings | Apr. 21, 1953 |
| 2,663,640 | Reichel et al. | Dec. 22, 1953 |
| 2,692,826 | Neugebauer et al. | Oct. 26, 1954 |
| 2,696,435 | Neugebauer et al. | Dec. 7, 1954 |
| 2,773,765 | Sus et al. | Dec. 11, 1956 |
| 2,773,766 | Sus et al. | Dec. 11, 1956 |

FOREIGN PATENTS

| | | |
|---|---|---|
| 855,706 | Germany | Nov. 17, 1952 |

OTHER REFERENCES

Berichte, vol. 41, 1908, pages 2292 and 2293.

Rodionov et al.: Journal of Applied Chemistry, U.S.S.R., vol. 16, pages 20–27, 1943. Abstracted in Chem. Abstracts, vol. 38, column 2949, 1944.